(12) United States Patent
Kim

(10) Patent No.: US 7,786,601 B2
(45) Date of Patent: Aug. 31, 2010

(54) SEMICONDUCTOR CHIP AND MULTI-CHIP PACKAGE

(75) Inventor: Young-Min Kim, Seongnam-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 381 days.

(21) Appl. No.: 11/503,839

(22) Filed: Aug. 14, 2006

(65) Prior Publication Data

US 2007/0035037 A1    Feb. 15, 2007

(30) Foreign Application Priority Data

Aug. 12, 2005   (KR) .................. 10-2005-0074222

(51) Int. Cl.
*H01L 23/48* (2006.01)
(52) U.S. Cl. ............... 257/781; 257/786; 257/E23.169
(58) Field of Classification Search .......... 257/781, 257/758, 738, 772, 779, E23.169, E23.015, 257/E23.02, 736, 746–748, 776, 786, 784, 257/780

See application file for complete search history.

(56) References Cited

U.S. PATENT DOCUMENTS 7,132,752 B2 * 11/2006 Saeki .................. 257/777
2005/0093167 A1   5/2005 Saeki

FOREIGN PATENT DOCUMENTS

| JP | 09-153662 | 6/1997 |
| JP | 11-307684 | 11/1999 |
| JP | 2001-007278 | 1/2001 |
| JP | 2004-047715 | 2/2004 |

* cited by examiner

*Primary Examiner*—Hoa B Trinh
*Assistant Examiner*—Sue A Purvis
(74) *Attorney, Agent, or Firm*—F. Chau & Associates, LLC

(57) ABSTRACT

There is provided a semiconductor chip and a multi-chip package. Each semiconductor chip includes a plurality of pads formed on a first surface thereof and electrically connected to an integrated circuit, and interconnection patterns formed as stripes on a second surface of the semiconductor chip. The interconnection patterns are formed by transferring a part of the basic layout configured with a pattern of stripes extending from a center portion to an edge portion, wherein the pads are electrically connected to the interconnection patterns.

12 Claims, 16 Drawing Sheets

SEMICONDUCTOR CHIP AND MULTI-CHIP PACKAGE

CROSS-REFERENCE TO RELATED PATENT APPLICATION

This application claims priority to Korean Patent Application No. 2005-0074222, filed on Aug. 12, 2005, the disclosure of which is herein incorporated by reference in its entirety.

BACKGROUND OF THE INVENTION

1. Technical Field

The present disclosure relates to a semiconductor device and more particularly, to a semiconductor chip and a multi-chip package having a plurality of stacked semiconductor chips.

2. Discussion of Related Art

Package technologies have been developed such as multi-chip packages and the system in package (SIP), in which, for example, memory, logic and analog devices are combined and packaged in a single chip, thereby reducing the number of components required to implement various functions and the size and cost of the semiconductor device.

In a conventional multi-chip package, a plurality of chips is mounted within a single package such that the chips are stacked on one another with buffer layers interposed therebetween, wherein the bonding pads on the chips are connected to pads on a lead frame or a PCB substrate by bonding wires. However, a long distance between the pads interconnected by the bonding wires may result in, for example, undesirable bending of the bonding wires due to an applied tensile force, unreliable wire bonds, or undesired contact of the wires onto non-designated portions of semiconductor chips. Conventional multi-chip packages may include an interface chip between semiconductor chips.

FIG. 1 is a view illustrating a conventional multi-chip package with an interface chip interposed between chips.

Referring to FIG. 1, a first semiconductor chip 20 is stacked on a substrate 10, and a second semiconductor chip 40 is stacked on the first semiconductor chip 20 with an interface chip 30 interposed therebetween. The interface chip 30 includes an interconnection layer 32 radially formed from a central portion to an edge portion. Pads 12 and 42 are formed on the substrate 10 and the second semiconductor chip 40, respectively. The pads on the substrate 10 are electrically connected to the pads on the second semiconductor chip 40. The interface chip 30 serves as an intermediate medium for establishing an electrical connection between the semiconductor second chip 40 and the substrate 40. The pads or the substrate 10 and the interconnection layer 32 of the interface chip 30 are electrically connected by bonding wires 14, and the interface chip 30 and the second semiconductor chip 40 are electrically connected by bonding wires 42, so that the substrate 10 and the semiconductor chip 40 are electrically connected through the interface chip 30. The stacked structure of the multi-chip package may prevent defects caused when a tensile force is applied to the bonding wire due to a difference in height and size between the semiconductor chip 40 and the substrate 10 and as a result of the long distance between the pads thereof.

Establishing electrical connections between semiconductor chips or between a substrate and a semiconductor chip using an interface board may increase stack size and can cause an excessive increase in the thickness of a package. The size of the interface board is greater than the size of the semiconductor chip, because pads on the semiconductor chip are connected to an interconnection layer of the interface board by bonding wires, and thus the stacking order can be limited depending upon the size of the semiconductor chip.

SUMMARY OF THE INVENTION

In an exemplary embodiment of the present invention, a semiconductor chip includes a plurality of pads formed on a first surface of the semiconductor chip and electrically connected to an integrated circuit, and interconnection patterns formed as stripes on a second surface of the semiconductor chip, the interconnection patterns being formed by transferring a part of a basic layout configured with a pattern of stripes extending from a center portion to an edge portion thereof, wherein the pads are electrically connected to the interconnection patterns. The pads and the interconnection patterns may be electrically connected through vias penetrating the semiconductor chip.

The basic layout may be divided into four isosceles triangles sharing a common point, and may be configured with a pattern of stripes extending vertically from a long side of each triangle. The basic layout may be configured with a pattern of radially extending stripes. The basic layout may be divided into four quadrangles sharing a common point, and may be configured with a pattern of stripes extending, in each quadrangle, substantially parallel to a diagonal line facing a center portion of the basic layout.

In an exemplary embodiment of the present invention, a multi-chip package includes a plurality of semiconductor chips stacked on one another, making electrical connections therebetween, each of the semiconductor chips includes a plurality of pads on a first surface electrically connected to an integrated circuit of the semiconductor chip, and interconnection patterns formed as on a second surface of each semiconductor chip, the interconnection patterns being formed by transferring a part of a basic layout configured with a pattern of stripes extending radially from the center portion to an edge portion thereof, wherein portions of the pads are electrically connected to portions of the interconnection patterns through vias penetrating the semiconductor chip.

The first and second semiconductor chips may be electrically connected to each other such that first surfaces thereof face each other to make a pad-to-pad contact, or the first and second surfaces thereof face each other to make a pad-to-interconnection pattern contact, or second surfaces thereof face each other to make an interconnection pattern-to-interconnection pattern contact.

In an exemplary embodiment of the present invention, the interconnection patterns of the semiconductor chips having second surfaces in contact with each other include common portions formed by transferring a common region of the basic layout thereon. The first and second semiconductor chips are electrically connected such that the common portions of their interconnection patterns formed by transferring the common region of the basic layout make contact with each other.

In an exemplary embodiment of the present invention, the semiconductor chips respectively having first and second surfaces in contact with each other are electrically connected together such that the pads of the first surface make contact with the interconnection patterns of the second surface.

In an exemplary embodiment of the present invention, a multi-chip package may include semiconductor chips, each having interconnection patterns on a first surface formed as stripes and pads on a first surface having the same striped patterns as the interconnection patterns. Each of the semiconductor chips may make contact with a first or second surface of an adjacent semiconductor chip. The interconnection patterns of the adjacent semiconductor chip and the pads formed as the striped patterns include common portions formed by transferring a common region of the basic layout thereon, and are electrically connected with each other such that the common portions make contact with each other.

BRIEF DESCRIPTION OF THE DRAWINGS

The present invention will become readily apparent to those of ordinary skill in the art when descriptions of exemplary embodiments thereof are read with reference to the accompanying drawings.

DESCRIPTION OF EXEMPLARY EMBODIMENTS

Figure 1:
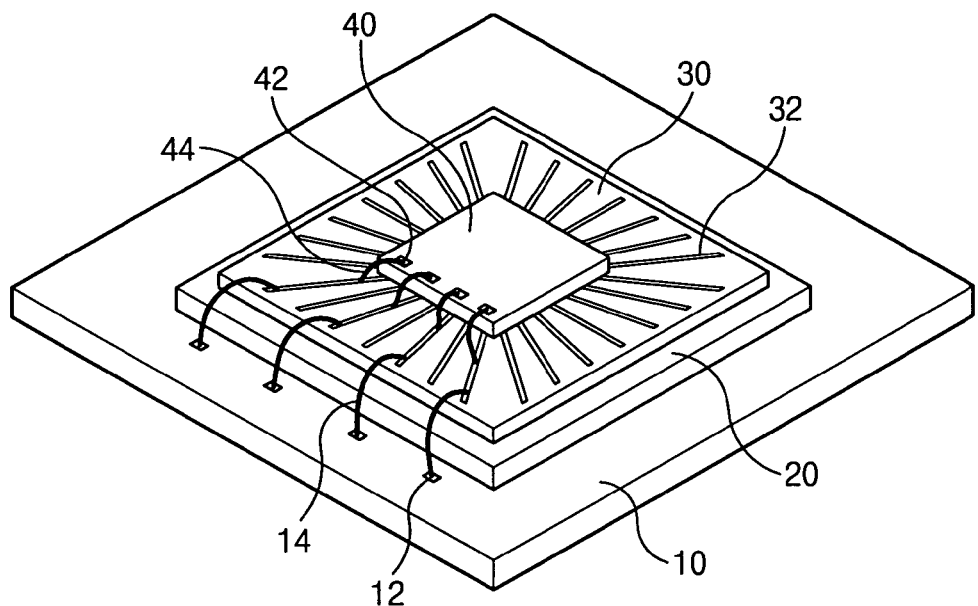
FIG. 1 is a view illustrating a conventional multi-chip package of a semiconductor device.

Hereinafter, exemplary embodiments of the present invention will be described in detail with reference to the accompanying drawings. In the drawings, the size and relative sizes of layers and regions may be exaggerated for clarity. Like reference numerals refer to similar or identical elements throughout the description of the figures.

Figure 2:
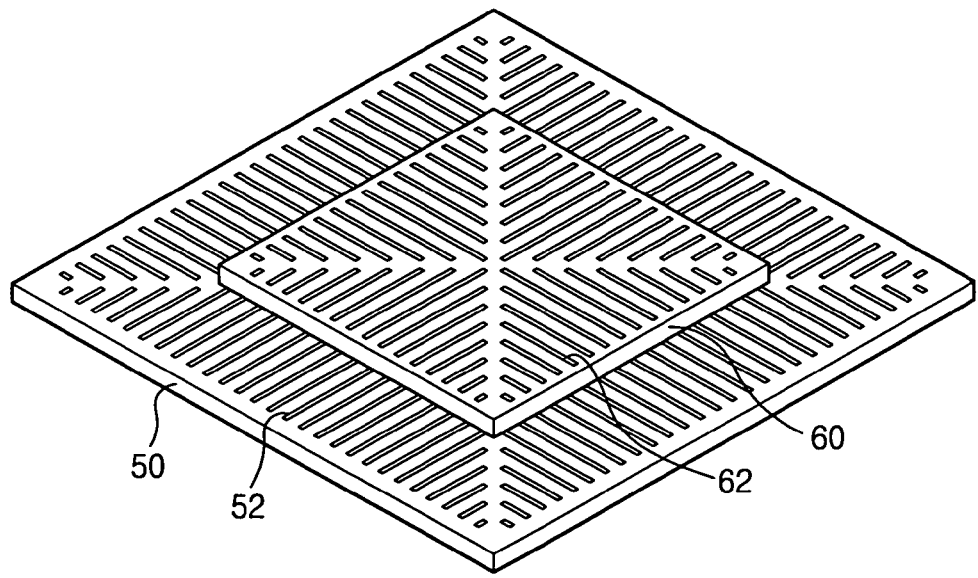
FIG. 2 is a view illustrating a multi-chip package of a semiconductor device according to an exemplary embodiment of the present invention.

FIG. 2 is a view illustrating a multi-chip package of a semiconductor device according to an exemplary embodiment of the present invention.

Referring to FIG. 2, a semiconductor chip 60 (referred to hereinafter as "upper semiconductor chip 60") is stacked on a semiconductor chip 50 (referred to hereinafter as "lower semiconductor chip 50") in the multi-chip package. It will be appreciated that more than two semiconductor chips may be stacked on one another. The lower semiconductor chip 50 and the upper semiconductor chip 60 include interconnection patterns 52 and 62, respectively. The interconnection patterns 52 and 62 may be formed as stripes, that is, striped interconnection patterns. Although not shown as such in FIG. 2, striped interconnection patterns may be formed on a lower surface of the upper semiconductor chip 60 which is in contact with the lower semiconductor chip 50. When the upper semiconductor chip 60 makes contact with the lower semiconductor chip 50, the striped interconnection patterns of the upper semiconductor chip 60 overlap the interconnection patterns 52 on the lower chip 50. The upper semiconductor chip 60 may be greater or smaller in size than the lower semiconductor chip 50, and may also have a different shape from that of the lower semiconductor chip 50.

The interconnection patterns on the lower semiconductor chip 50 and the upper semiconductor chip 60 are formed by transferring a part of the basic layout thereon. An electrical connection between the upper and lower semiconductor chips may be made with their common portions making contact with each other, wherein the common portions are formed by transferring a common region of the basic layout thereon. Pads may be formed on a front surface of a semiconductor chip and may be electrically connected to an integrated circuit on the chip. The interconnection patterns 52 and 62 may be formed on a rear surface of the semiconductor chip. The pads on the semiconductor chip may be formed as substantially the same striped patterns as the interconnection patterns 52. The pads and the interconnection patterns may be overlappingly formed as substantially the same striped patterns on the front surface and the rear surface of a semiconductor chip, respectively.

The lower semiconductor chip 50 and the upper semiconductor chip 60 have interconnection patterns formed by transferring a part of the basic layout thereon, and a position where the upper semiconductor chip 60 is stacked on the lower semiconductor chip 50 may vary depending upon the transferred interconnection patterns. For example, if the interconnection patterns on each semiconductor chip correspond to a central part of the basic layout, the upper semiconductor chip 60 may be stacked on the lower semiconductor chip 50 with their central portions aligned. However, if the central part of the basic layout is transferred onto the lower semiconductor chip 50 and an edge part thereof is transferred onto the upper semiconductor chip 60, the upper semiconductor chip 60 may be stacked on an edge of the lower semiconductor chip 50 onto which a common region of the basic layout has been transferred.

In the multi-chip package according to exemplary embodiments of the present invention, semiconductor chips are electrically connected with one another by an interconnection pattern-to-pad contact, an interconnection pattern-to-interconnection pattern contact, or a pad-to-pad contact. The semiconductor chips may be electrically connected without using bonding wires, and such a direct connection between the semiconductor chips may contribute to achieving thinness of the package. In an exemplary embodiment of the present invention, the interconnection patterns of the semiconductor chips have common portions formed by transferring a common region of the basic layout thereon, and a smaller semiconductor chip may be stacked on a larger semiconductor chip.

Figure 3A:
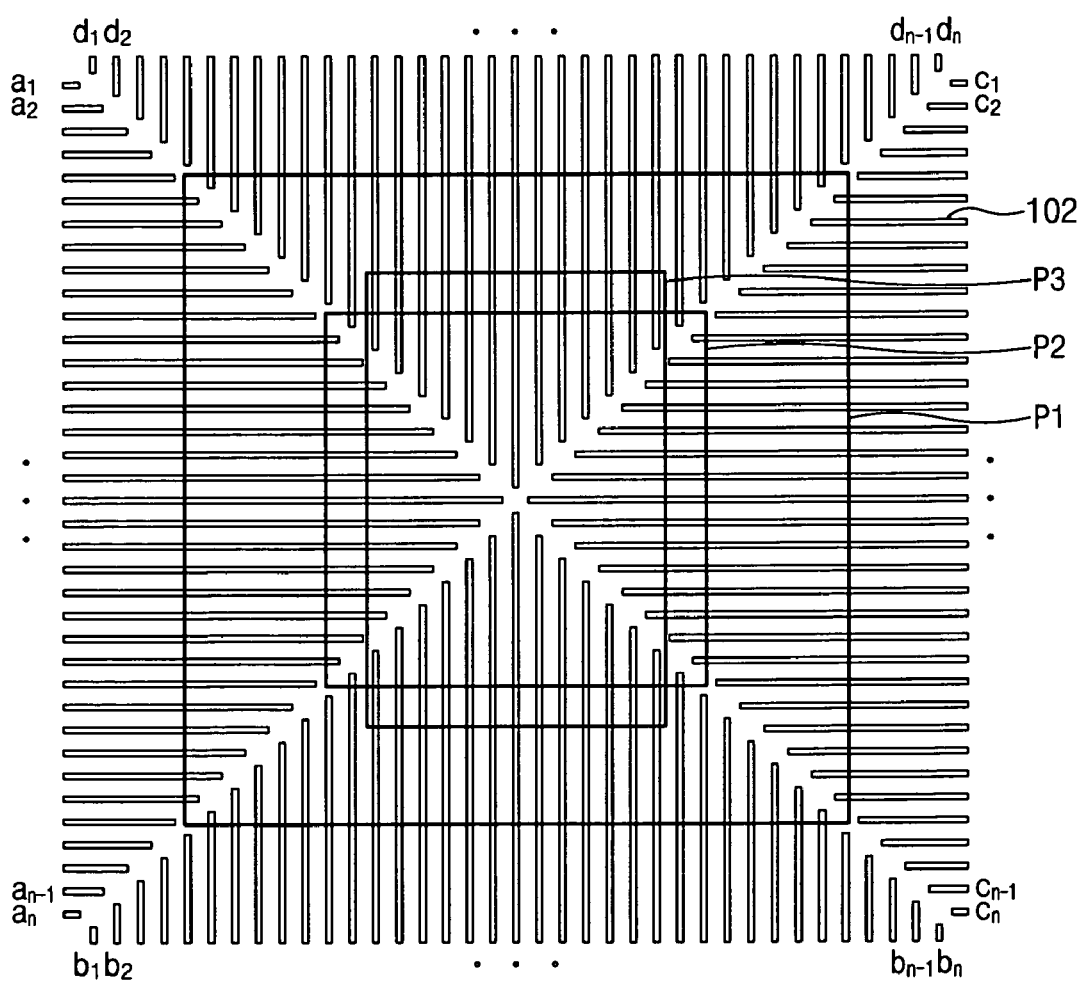
FIGS. 3A through 3C are views illustrating basic layouts according to exemplary embodiments of the present invention.
Figure 3B:
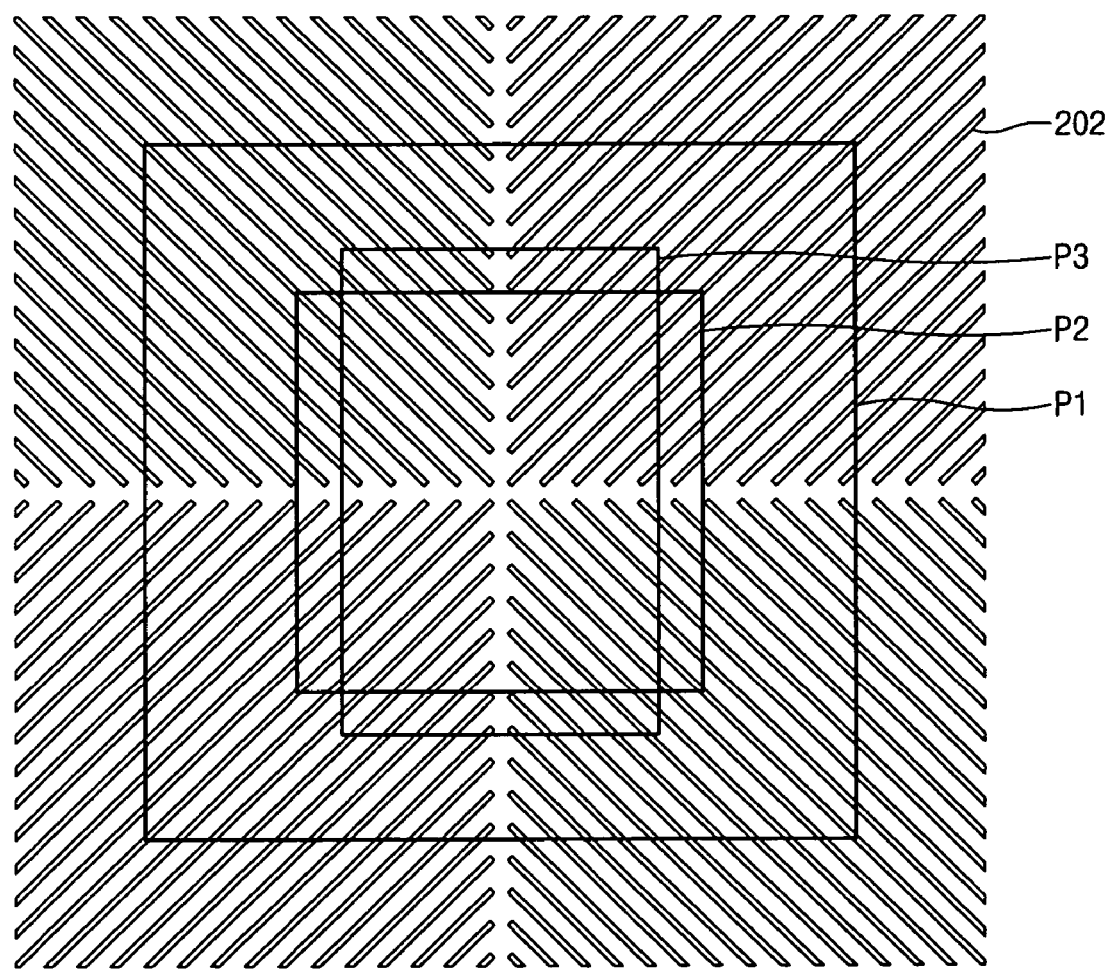
Figure 3C:
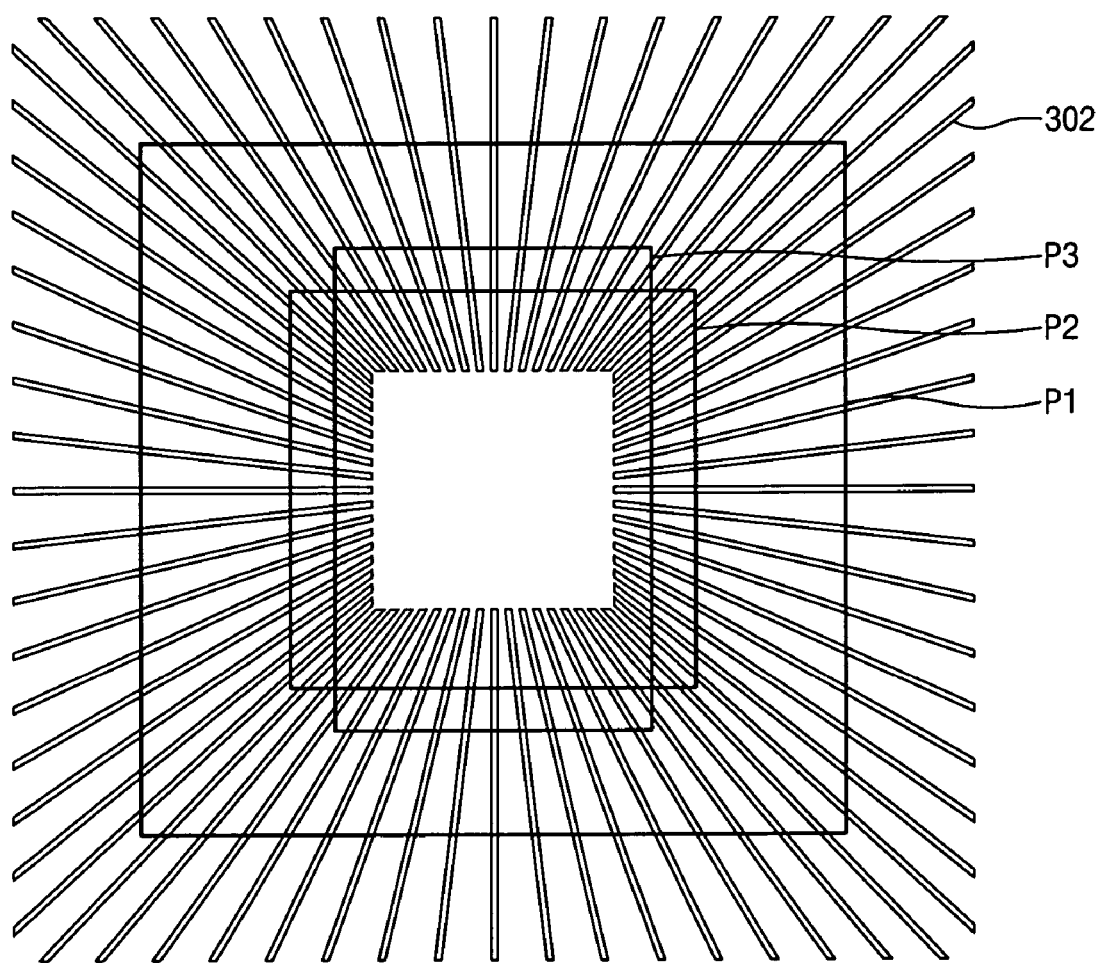

FIGS. 3A through 3C are views illustrating basic layouts according to exemplary embodiments of the present invention. FIGS. 4A through 4C, FIGS. 5A through 5C, and FIGS. 6A through 6C are views illustrating semiconductor chips onto which the basic layouts have been transferred, according to exemplary embodiments of the present invention.

Interconnection patterns or pads are formed as striped patterns by transferring a part of the basic layout onto a semiconductor chip according to exemplary embodiments of the present invention. In the basic layouts, the striped patterns may extend from a central part to an edge part thereof. As shown in FIG. 3A, a basic layout 100 according to an exemplary embodiment of the present invention is divided into four regions. The four regions in FIG. 3A are isosceles triangles sharing a common point, and in each region, striped patterns 102 extend vertically from the base line of the isosceles triangle. That is, from the overall view, the basic layout 100 is configured with striped patterns intersecting at the center of the layout 100. According to exemplary embodiments of the present invention, a part of the basic layout is transferred onto a semiconductor chip. For example, one of regions P1, P2 and P3 of the basic layout may be selected according to the shape of the semiconductor chip and then transferred onto the semiconductor chip to form interconnection patterns or pads. The striped patterns 102 of FIG. 3A are labeled with IDs $a_n$, $b_n$, $c_n$, $d_n$, respectively.

Figure 4A:
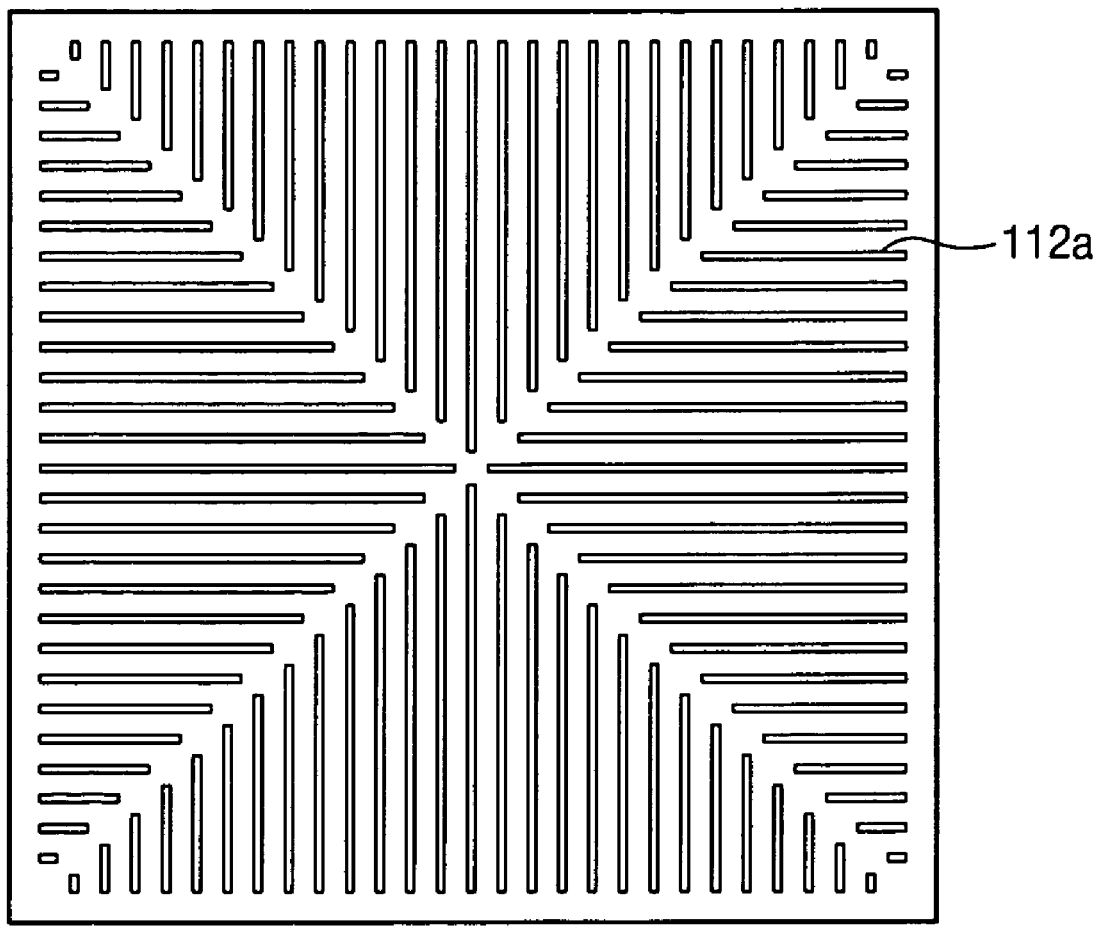
FIGS. 4A through 4C, FIGS. 5A through 5C, and FIGS. 6A through 6C are views illustrating patterns for a semiconductor chip according to exemplary embodiments of the present invention.
Figure 4B:
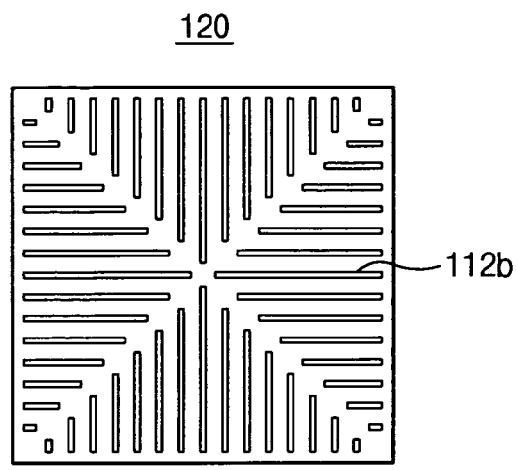
Figure 4C:
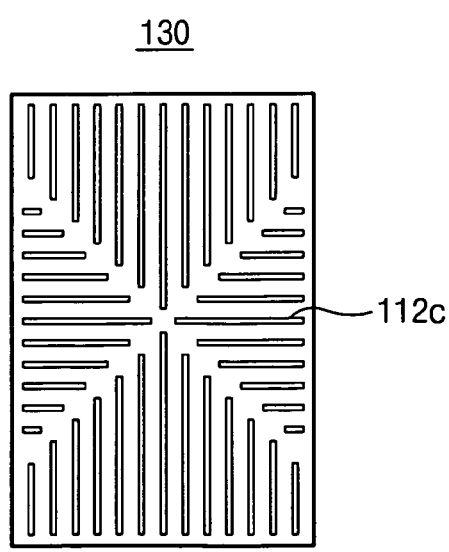

As shown in FIGS. 4A through 4C, the regions P1, P2 and P3 of the basic layout are transferred to form striped interconnection patterns 112a, 112b and 112c, respectively, on the corresponding semiconductor chips 110, 120 and 130. The interconnection patterns may be formed at substantially the same pitch regardless of the size and shape of the semiconductor chips 110, 120 and 130. According to an exemplary embodiment of the present invention, each of the interconnection patterns 112a, 112b and 112c includes at least one common portion onto which a common region of the basic layout is transferred, and when the semiconductor chips are stacked on one another, the striped patterns having the same ID overlap each other to make an electrical connection therebetween.

As illustrated in FIG. 3B, a basic layout 200 according to an exemplary embodiment of the present invention is divided into four quadrangular regions sharing a common point. In each region, striped patterns 202 extend substantially parallel to a diagonal line that joins the shared common point and the diagonally opposite point. That is, from the overall view, the basic layout 200 is configured with striped patterns 202 that extend substantially parallel to diagonal lines intersecting at the center of the layout 200.

Figure 5A:
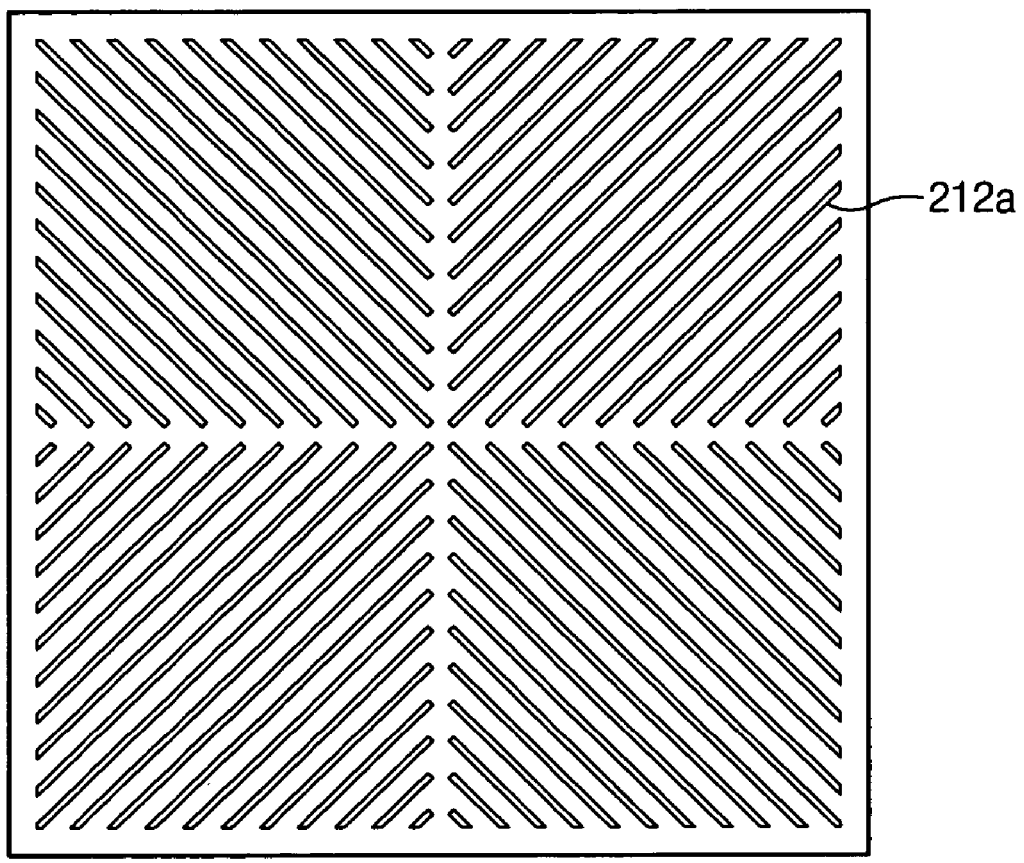
Figure 5B:
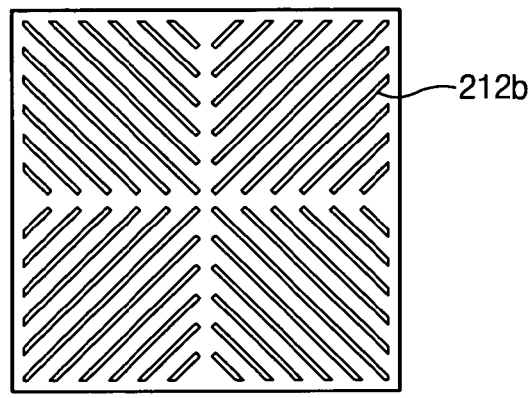
Figure 5C:
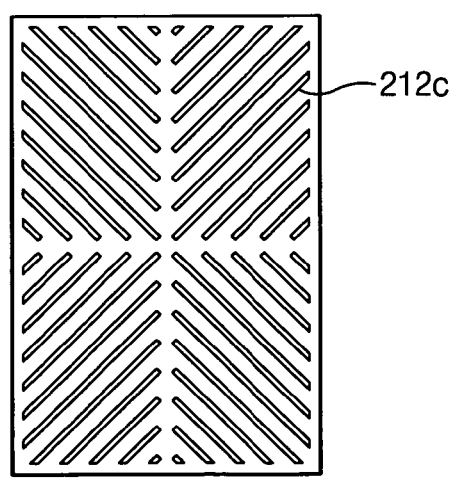

As illustrated in FIGS. 5A through 5C, a part of the basic layout 200 is transferred onto the semiconductor chips 210, 220 and 230. Regions P1, P2 and P3 of the basic layout 200 are transferred to form striped interconnection patterns 212a, 212b and 212c on the semiconductor chips 210, 220 and 230, respectively. The interconnection patterns 212a, 212b and 212c are formed at the same pitch regardless of the size and shape of the semiconductor chips 210, 220 and 230. Each of the interconnection patterns 212a, 212b and 212c of the semiconductor chips 210, 220 and 230 includes at least one portion onto which a common region of the basic layout is transferred.

Specific IDs may be allocated to the striped patterns 202 of the basic layout 200. When the semiconductor chips are stacked on one another, the striped patterns of the same ID overlap each other to allow an electrical connection therebetween.

As illustrated in FIG. 3C, a basic layout 300 is configured with striped patterns that radially extend from a central part to an edge part of the basic layout 300. In this case, striped patterns are not formed in a predetermined region of the central part of the basic layout because intervals between striped patterns 302 may not be secured at the central part of the basic layout 300.

Figure 6A:
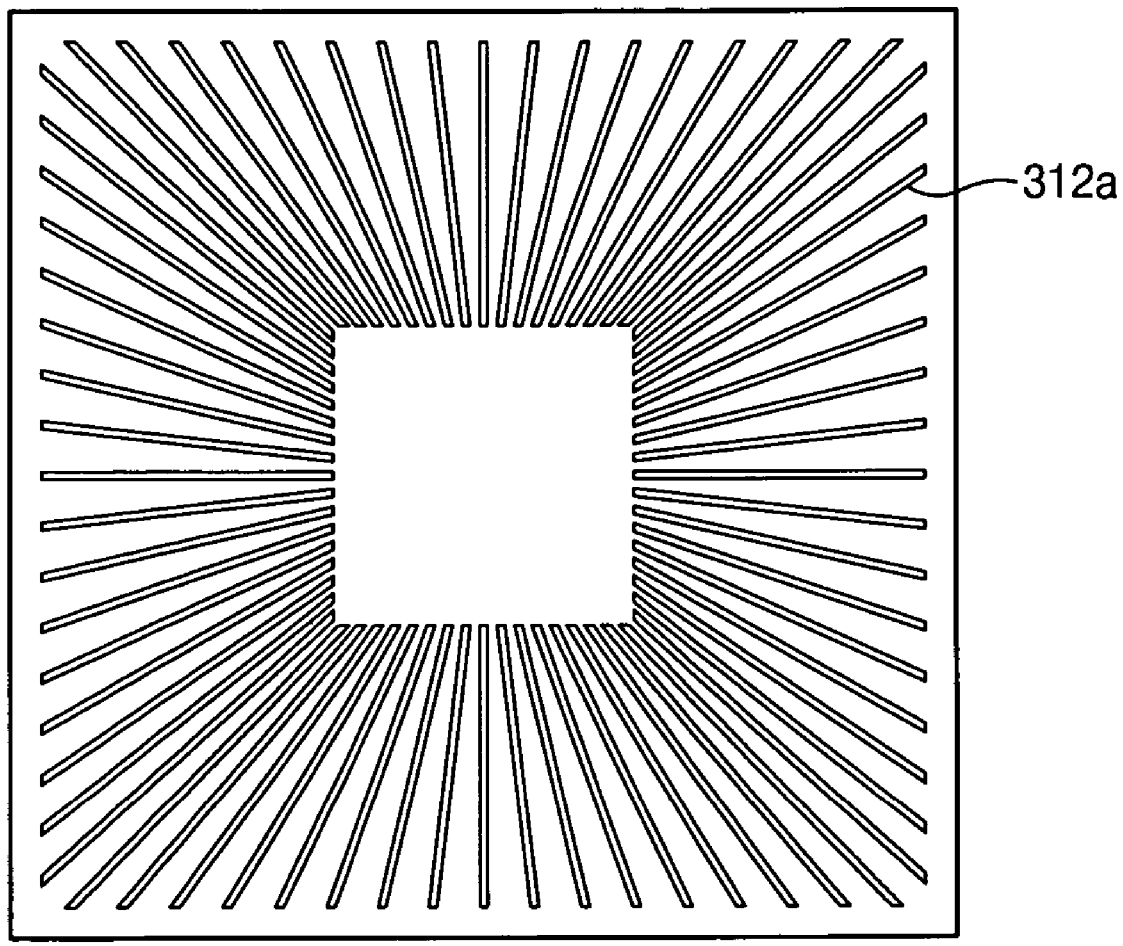
Figure 6B:
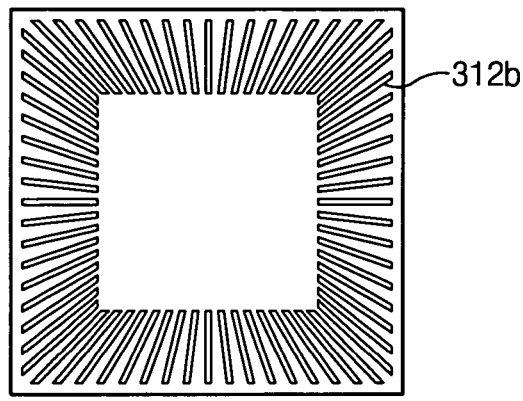
Figure 6C:
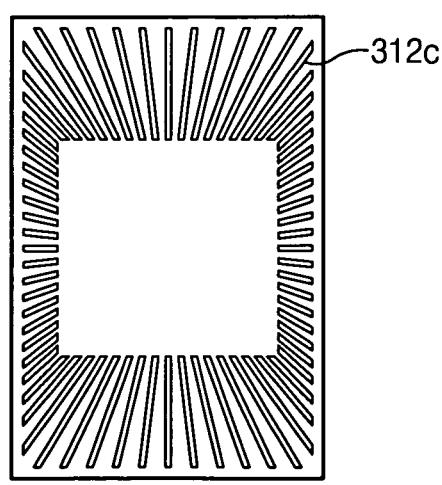

As illustrated in FIGS. 6A through 6C, a part of the basic layout 300 is transferred onto the semiconductor chips 310, 320 and 330. Regions P1, P2 and P3 of the basic layout 300 are transferred to form striped interconnection patterns 312a, 312b and 312c on the semiconductor chips 310, 320 and 330, respectively. The interconnection patterns 312a, 312b and 312c are formed at the same pitch regardless of the size and shape of the semiconductor chips 310, 320 and 330. Each of the interconnection patterns 312a, 312b and 312c of the semiconductor chips 310, 320 and 330 includes at least one common portion onto which a common region of the basic layout is transferred.

The striped patterns 302 of the basic layout 300 may be label with IDs. When the semiconductor chips are stacked on one another, the striped patterns of the same ID overlap each other to allow an electrical connection therebetween.

Figure 7A:
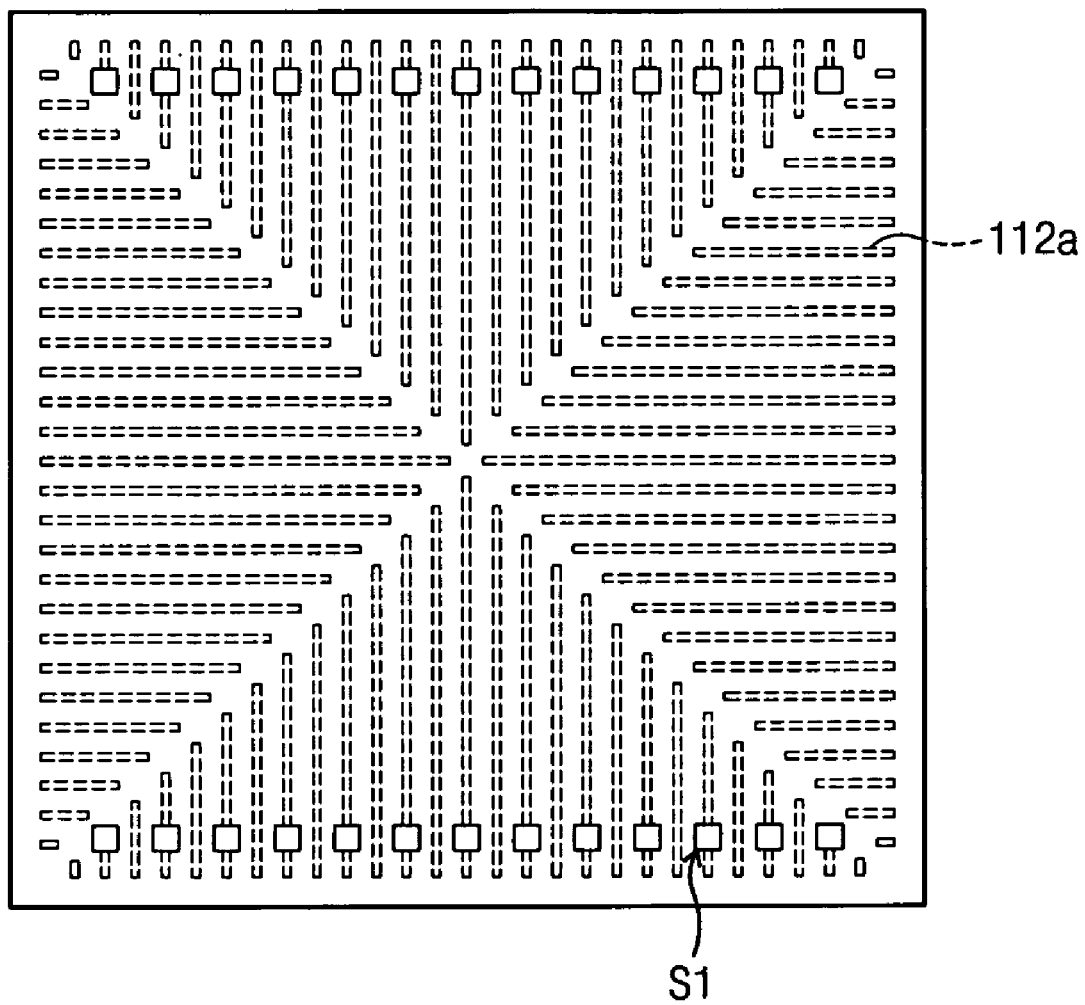
FIGS. 7A through 7C are views illustrating pad arrangements for a semiconductor chip according to exemplary embodiments of the present invention.
Figure 7B:
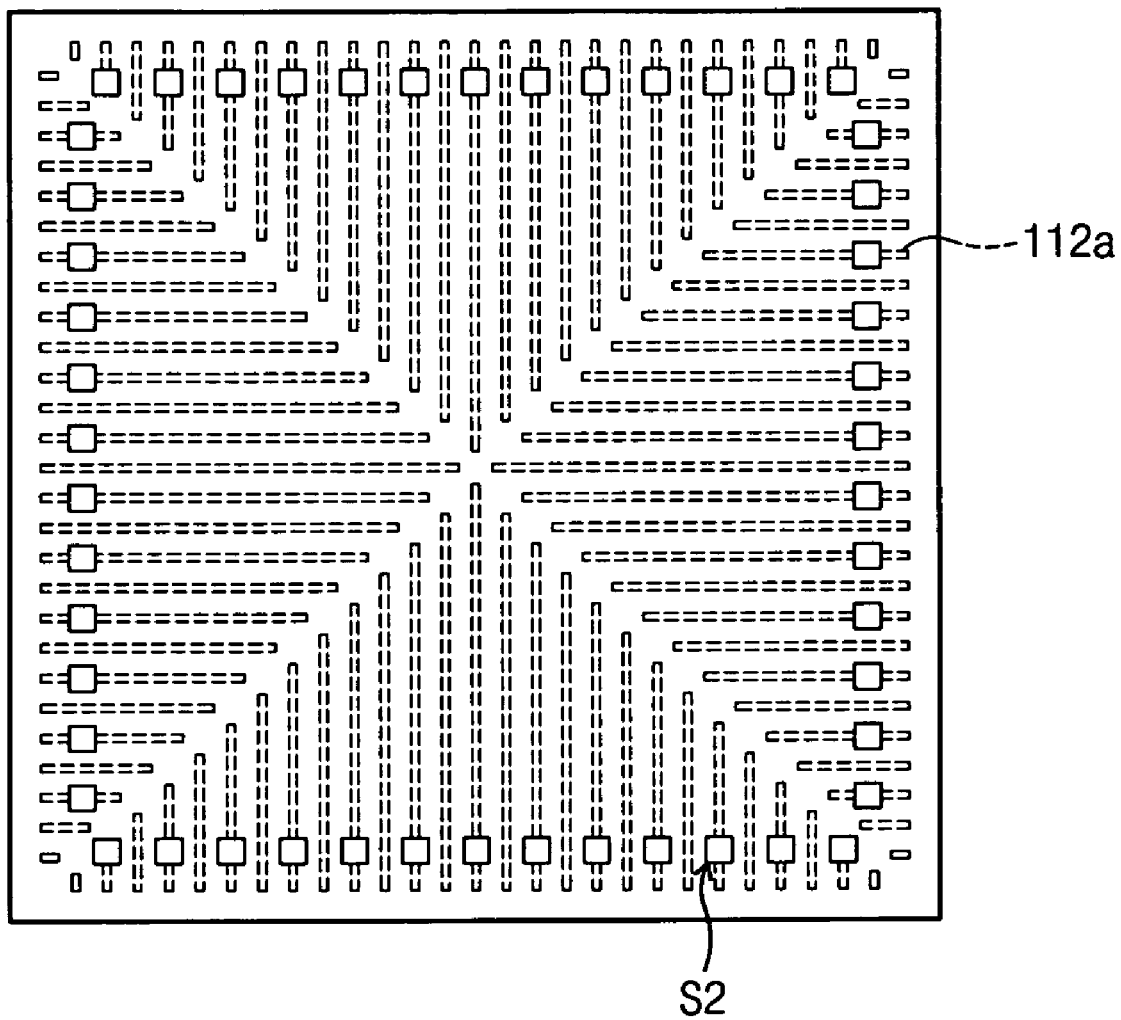
Figure 7C:
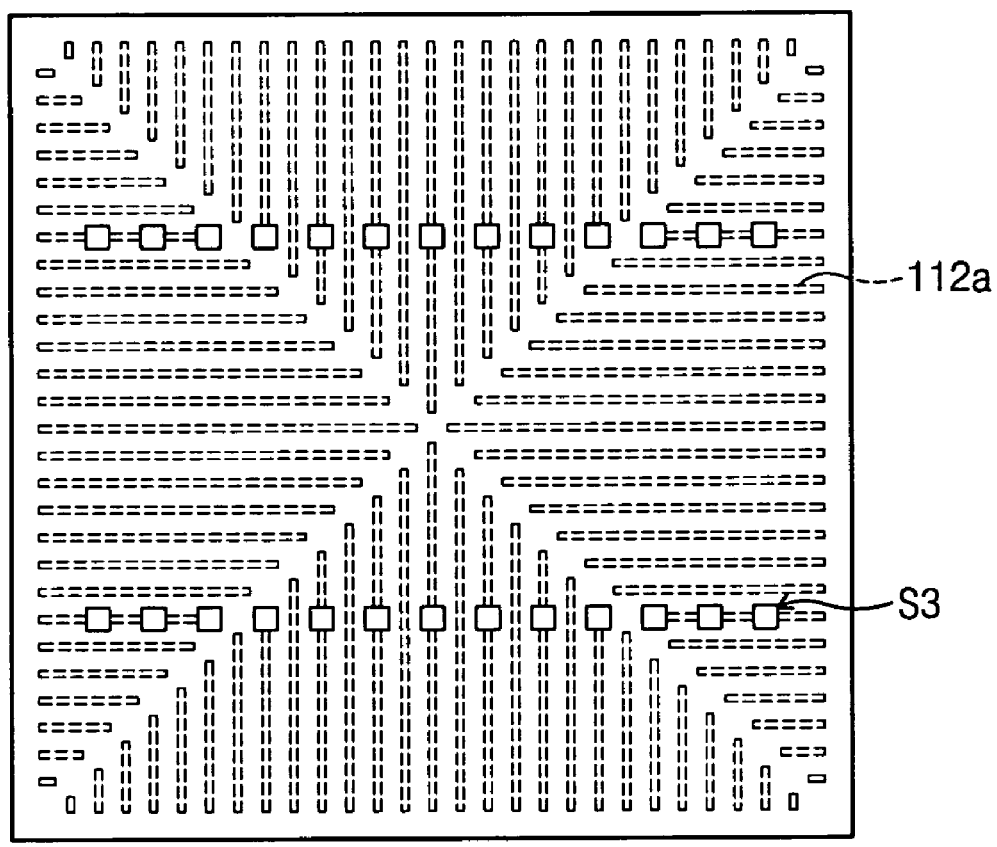

FIGS. 7A through 7C are views illustrating the pad distribution for the semiconductor chip of FIG. 4A, according to exemplary embodiments of the present invention. Such pad distribution may be applied to semiconductor chips onto which a part of any of the basic layouts according to exemplary embodiments of the present invention have been transferred, such as the basic layout 100 of FIG. 3A and the basic layout 200 and 300 of FIGS. 3B and 3C.

Referring to FIG. 7A, pads S1 of a semiconductor chip according to an exemplary embodiment of the present invention are formed on a front surface of the semiconductor chip having an integrated circuit, and are electrically connected to the integrated circuit. The pads S1 may be disposed in two regions respectively adjacent to the opposite sides of the chip. Here, the pads S1 are electrically connected to the interconnection patterns 112a formed on a rear surface of the chip. The connections between the pads and the interconnection patterns maybe selectively designed according to the kind of a chip.

Referring to FIG. 7B, pads S2 of a semiconductor chip according to an exemplary embodiment of the present invention are formed on the front surface of the semiconductor chip having an integrated circuit, and are electrically connected to the integrated circuit. The pads S2 may be disposed adjacent to the four sides of the chip. Here, the pads S2 are electrically connected to the interconnection patterns 112a formed at the rear surface of the chip. The connections between the pads and the interconnection patterns may be selectively designed according to the kind of a chip.

Referring to FIG. 7C, pads S3 of the semiconductor chip according to an exemplary embodiment of the present invention are formed on the front surface of the semiconductor chip having an integrated circuit, and are electrically connected to the integrated circuit. The pads S3 may be disposed at a central portion of the chip, instead of an edge portion. Here, the pads S3 are electrically connected to the interconnection patterns 112a formed at a rear surface of the chip. The connections between the pads and the interconnection patterns may be selectively designed according to the kind of a chip.

It is to be understood that the distribution structure of the pads of the semiconductor chip is not limited to the structures illustrated in FIGS. 7A through 7C, but may be modified in various manners. The pads of the semiconductor chip may be formed as stripes that are substantially the same as the interconnection patterns on the rear surface of the chip. Here, the pads formed on the front surface of the semiconductor chip may or may not overlap the interconnection patterns formed on the rear surface.

A pad and an interconnection pattern of a semiconductor chip may be electrically connected to each other by a via. Here, if the pad is formed as a dot, the pad and the interconnection pattern on the rear surface may be electrically connected through the via penetrating the semiconductor chip. When the pad is formed as substantially the same striped pattern as the interconnection pattern, the pad and the interconnection pattern may be electrically connected through a plurality of vias formed in a space within the semiconductor chip.

Figure 8:
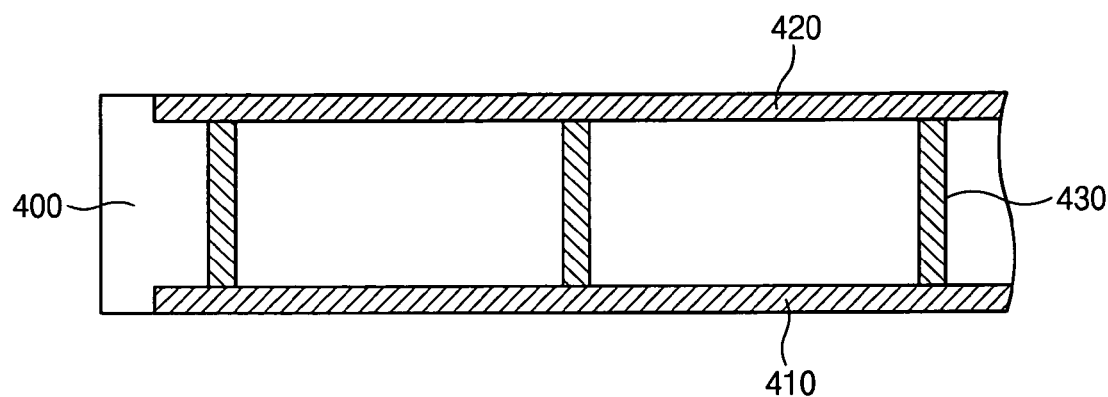
FIGS. 8 and 9 are cross-sectional views illustrating connection structures between a first pad and a second pattern of a semiconductor chip according to an exemplary embodiment of the present invention.
Figure 9:
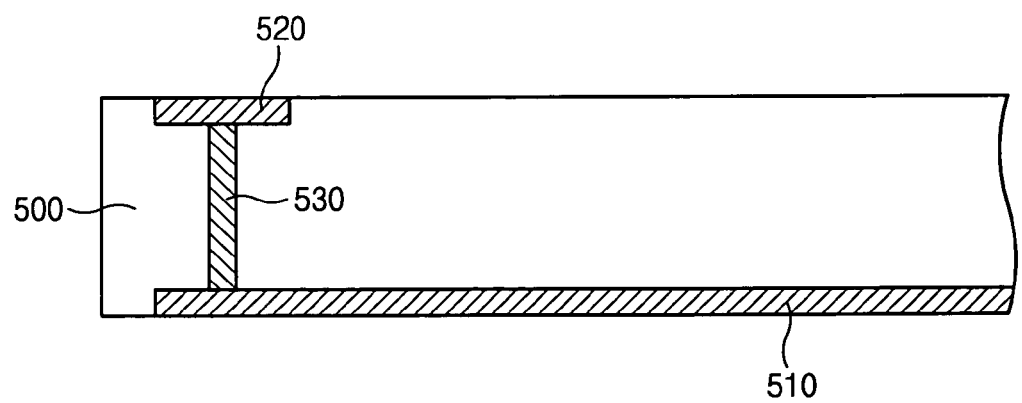

FIGS. 8 and 9 are cross-sectional views illustrating a connection structure between the front pad and the rear interconnection pattern of a semiconductor chip according to exemplary embodiments of the present invention.

Referring to FIG. 8, a pad 420 is formed on a front surface of a semiconductor chip 400 as substantially the same striped pattern as an interconnection pattern 410. When overlapping with each other, the interconnection pattern 410 and the pad 420 are electrically connected through a plurality of vias 430 formed in a portion of the semiconductor chip. The portion of the semiconductor chip may be a device isolation region where no unit device is formed and which does not overlap a multilayered interconnection of an integrated circuit.

Referring to FIG. 9, when a pad 520 is formed as a dot on a front surface of a semiconductor chip, the pad 520 and an interconnection pattern 510 may be electrically connected through one via 530. However, the via 530 may comprise a plurality of sub-vias.

The pad formed on the front surface of the semiconductor chip may be electrically connected with the interconnection pattern on the rear surface through an internal interconnection without being connected directly through the via.

As illustrated in FIGS. 4A through 4C, FIGS. 5A through 5C, and FIGS. 6A through 6C, semiconductor chips according to exemplary embodiments of the present invention include, on a rear surface, striped interconnection patterns extending to the vicinity of a central portion of the semiconductor chips, and include pads such as dots or stripes on a front surface. When semiconductor chips are stacked on one another, the interconnection patterns are electrically connected at portions where the upper and lower semiconductor chips are in contact with one another. According to exemplary embodiments of the present invention, an upper semiconductor chip 60 is greater or smaller in size than a lower semiconductor chip 50 or the upper and lower semiconductor chips have different shapes, common portions of the upper and lower semiconductor chips, which are formed by transferring a common region of the basic layout thereon, make contact with each other, thereby making an electrical connection therebetween.

Figure 10:
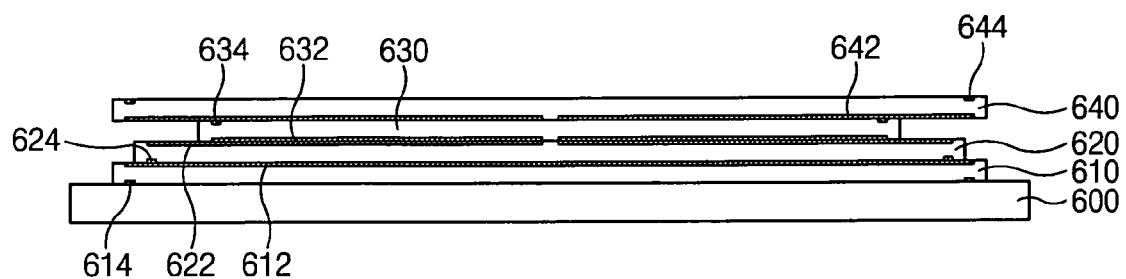
FIGS. 10 and 11 are cross-sectional views illustrating a semiconductor-chip stacking structures for a multi-chip package according to an exemplary embodiment of the present invention.
Figure 11:
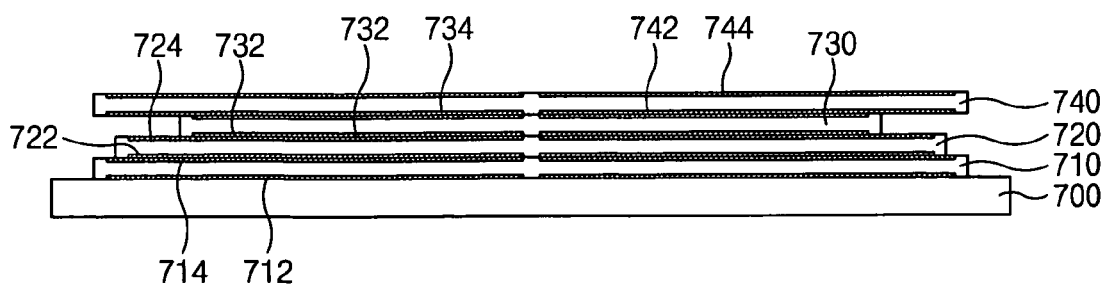

FIGS. 10 and 11 are cross-sectional views of a semiconductor-chip stacked structure of a multi-chip package according to exemplary embodiments of the present invention.

Referring to FIG. 10, interconnection patterns 612, 622, 632 and 642 are formed by transferring the basic layout onto rear surfaces of semiconductor chips 610, 620, 630 and 640 stacked on a substrate 600, respectively. The pads 614, 624, 634 and 644 are formed as dots on front surfaces of the semiconductor chips 610, 620, 630 and 640. As in the case of the lowermost semiconductor chip 610 and a semiconductor chip 620, semiconductor chips may be electrically connected with each other such that interconnection patterns 612 on a rear surface make contact with pads 624 on a front surface. As in the case of the semiconductor chips 620 and 630, semiconductor chips may be electrically connected with each other such that interconnection patterns 622 on a rear surface make contact with interconnection patterns 632 on a rear surface. The interconnection patterns may extend to the vicinity of the center portion of the semiconductor chip, and the size of an upper semiconductor chip may be smaller than a lower semiconductor chip, such as in the case of semiconductor chips 620 and 630, or the size of an upper semiconductor chip may be greater than that of a lower semiconductor chip, such as in the case of semiconductor chips 630 and 640.

Referring to FIG. 11, striped interconnection patterns 712, 722, 732 and 742 are formed by transferring the basic layout onto rear surfaces of semiconductor chips 710, 720, 730 and 740 stacked on a substrate 600, respectively. The pads 714, 724, 734 and 744 are formed as stripes substantially identical to the interconnection patterns on front surfaces of the semiconductor chips 710, 720, 730 and 740.

Forming the same striped patterns on both front and rear surfaces of each semiconductor chip of a multi-chip package structured as illustrated in FIG. 11 allows the semiconductor chips to be connected to one another by any contact, such as for example, a front-to-front contact, a rear-to-rear contact and a front-to-rear contact. Such contact may be selected depending upon an integrated circuit electrically connected thereto. Because the interconnection patterns extend to the vicinity of the center portion of the semiconductor chip in a multi-chip package structure according to an exemplary embodiment of the present invention, the size of an upper semiconductor chip may be smaller than a lower semiconductor chip or may be greater than the lower semiconductor chip.

Semiconductor chips stacked in a multi-chip package according to an exemplary embodiment of the present invention include interconnection patterns formed by transferring a part of a single layout. For example, common portions of such interconnection patterns are formed by transferring a common region of the basic layout and thus can make contact with each other.

Figure 12:
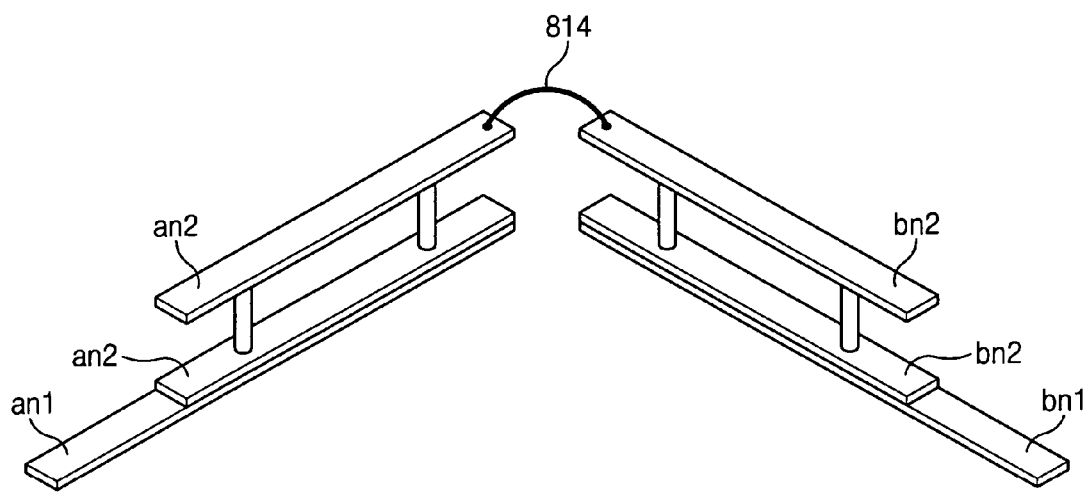
FIG. 12 is a view illustrating wire bonding for a multi-chip package according to an exemplary embodiment of the present invention.

As illustrated in FIG. 12, when interconnection patterns do not make contact with each other, bonding wires may be used for the electrical connection. For example, when an interconnection pattern an1 of a lower semiconductor chip should be connected with an interconnection pattern bn2 of an upper semiconductor chip, the interconnection pattern an1 and an interconnection pattern an2 of upper and lower semiconductor chips make contact with each other, and the interconnection patterns an2 and bn2 of the upper semiconductor chips are connected by a bonding wire 814, so that the interconnection pattern an1 of the lower semiconductor chip may be electrically connected to the interconnection pattern bn2 of the upper semiconductor chip.

According to exemplary embodiments of the present invention, patterns to be transferred as interconnection patterns onto rear surfaces of semiconductor chips are previously laid out in the basic layout, and a part of the basic layout is transferred onto the rear surfaces of the semiconductor chips such that common patterns are formed thereon regardless of the size and shape of the semiconductor chips.

According to an exemplary embodiment of the present invention, semiconductor chips are stacked on one another, making direct contact with one another, and an increase in thickness of a multi-chip package may be prevented. Also, undesirable bending of bonding wires or unstable contact thereof may be prevented from occurring in the first place because no bonding wires are used. According to an exemplary embodiment of the present invention, interconnection patterns extend to the vicinity of the center portion of a semiconductor chip, and the stacking order may be varied regardless of the size of the semiconductor chip.

Although the exemplary embodiments of the present invention have been described in detail with reference to the accompanying drawings for the purpose of illustration, it is to be understood that the inventive processes and apparatus should not be construed as limited thereby. It will be apparent to those of reasonable skill in the art that various modifications to the foregoing exemplary embodiments can be made without departing from the scope of the invention as defined by the appended claims, with equivalents of the claims to be included therein.

What is claimed is:

1. A semiconductor chip comprising:
   a plurality of pads formed on a first surface of the semiconductor chip and electrically connected to an integrated circuit; and
   interconnection patterns formed as stripes on a second surface of the semiconductor chip by transfer of a part of a basic layout configured with a plurality of striped patterns extending from a center portion to an edge portion thereof,
   wherein the pads are electrically connected to the interconnection patterns, and
   wherein the basic layout is divided into four isosceles triangles sharing a common point, and is configured with pattern of stripes extending vertically from a long side of each triangle.

2. The semiconductor chip of claim 1, wherein the interconnection patterns are at substantially the same pitch regardless of the size of the semiconductor chip.

3. The semiconductor chip of claim 1, wherein the pads are formed as the same patterns as the interconnection patterns on the second surface of the semiconductor chip.

4. The semiconductor chip of claim 1, wherein the interconnection patterns are formed by transferring a region of the basic layout, the region being concentric with the basic layout.

5. The semiconductor chip of claim 1, wherein the pads and the interconnection patterns are electrically connected through vias penetrating the semiconductor chip.

6. A multi-chip package comprising:
   a plurality of semiconductor chips stacked on one another, making electrical connections therebetween, each of the semiconductor chips including:
   a plurality of pads formed on a first surface thereof, wherein the pads are electrically connected to an integrated circuit on the semiconductor chip; and
   interconnection patterns formed as stripes on a second surface of the chip by transfer of a part of a basic layout configured with a pattern of stripes extending from a center portion to an edge portion,
   wherein portions of the pads are electrically connected to portions of the interconnection patterns, and
   wherein the basic layout is divided into four isosceles triangles sharing a common point, and is configured with pattern of stripes extending vertically from a long side of each triangle.

7. The multi-chip package of claim 6, wherein the interconnection patterns are at substantially the same pitch regardless of the size of the semiconductor chip.

8. The multi-chip package of claim 6, wherein the interconnection patterns of each of the semiconductor chips include common portions formed by transferring a common region of the basic region, wherein the semiconductor chips are disposed such that the second surfaces thereof face each other to make an interconnection pattern-to-interconnection pattern contact, and wherein
   the semiconductor chips are electrically connected such that the common portions of the interconnection patterns of the semiconductor chips make contact with each other.

9. The multi-chip package of claim 6, wherein the pads on the first surface of the semiconductor chip are formed as the striped patterns substantially identical to the interconnection patterns on the second surface thereof.

10. The multi-chip package of claim 9, wherein the semiconductor chip comprising the pads having the patterns substantially identical to the interconnection patterns makes contact with a first or second surface of an adjacent semiconductor chip,
    wherein the interconnection patterns of the adjacent semiconductor chip and the pads formed as the striped patterns include common portions formed by transferring a common region of the basic layout, and are electrically connected to each other such that the common portions make contact with each other.

11. The multi-chip package of claim 6, wherein the semiconductor chip further comprises a bonding wire selectively connecting the interconnection patterns thereof.

12. The multi-chip package of claim 6, wherein the pads of the first surfaces and the interconnection patterns of the second surfaces make contact with each other.

* * * * *